(12) United States Patent
Sun

(10) Patent No.: US 10,979,256 B2
(45) Date of Patent: Apr. 13, 2021

(54) RECEIVING CIRCUITS AND METHODS FOR INCREASING BANDWIDTH

(71) Applicant: Shanghai Zhaoxin Semiconductor Co., Ltd., Shanghai (CN)

(72) Inventor: Zhaoyang Sun, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/583,545

(22) Filed: Sep. 26, 2019

(65) Prior Publication Data

US 2020/0119956 A1   Apr. 16, 2020

(30) Foreign Application Priority Data

Oct. 15, 2018   (CN) .......................... 201811195242.5

(51) Int. Cl.
| H04L 25/03 | (2006.01) |
| H03F 3/50 | (2006.01) |
| H03G 3/30 | (2006.01) |
| H04B 3/18 | (2006.01) |

(52) U.S. Cl.
CPC ......... *H04L 25/03885* (2013.01); *H03F 3/50* (2013.01); *H03G 3/3063* (2013.01); *H04B 3/18* (2013.01); *H03F 2200/369* (2013.01)

(58) Field of Classification Search
CPC .... H04B 3/16; H04B 3/18; H04N 3/18; H03F 2200/369; H03F 3/50; H04L 25/03885; H03G 3/3063

See application file for complete search history.

(56) References Cited

U.S. PATENT DOCUMENTS

| 7,551,033 B2 | 6/2009 | Lin |
| 7,562,108 B2 * | 7/2009 | Singh ................. H03H 11/1291 708/819 |

(Continued)

FOREIGN PATENT DOCUMENTS

| CN | 101222209 A | 7/2008 |
| CN | 201887729 U | 6/2011 |

(Continued)

OTHER PUBLICATIONS

Zheng et al. "CMOS linear-in-dB VGA with DC offset cancellation for direct-conversion receivers", Oct. 2011, Journal of Semiconductors vol. 32, No. 10, p. 105007-1-105007-7.*

(Continued)

*Primary Examiner* — Sophia Vlahos
(74) *Attorney, Agent, or Firm* — McClure, Qualey & Rodack, LLP

(57) ABSTRACT

A receiving circuit and method for increasing bandwidth are provided. The receiving circuit includes a linear equalizer circuit and a variable gain amplifier. The linear equalizer circuit includes a first negative impedance converter, to generate a first capacitance. The variable gain amplifier is coupled to the linear equalizer circuit. The variable gain amplifier includes a first-stage gain circuit and a feedback circuit. The first-stage gain circuit is coupled to the feedback circuit, and the feedback circuit generates a zero-point at the output end of the first-stage gain circuit.

12 Claims, 5 Drawing Sheets

(56) References Cited

U.S. PATENT DOCUMENTS

| | | | |
|---|---|---|---|
| 7,961,050 B1* | 6/2011 | Swei | H03F 3/45192 330/304 |
| 8,680,937 B2 | 3/2014 | Chang | |
| 9,136,904 B2 | 9/2015 | Ali et al. | |
| 2014/0036982 A1* | 2/2014 | Ali | H04B 3/14 375/229 |
| 2015/0295736 A1* | 10/2015 | Bulzacchelli | H04L 25/03057 375/233 |
| 2016/0261435 A1* | 9/2016 | Musah | H04L 25/03019 |

FOREIGN PATENT DOCUMENTS

| | | |
|---|---|---|
| CN | 102469054 A | 5/2012 |
| CN | 102751962 A | 10/2012 |
| CN | 103036517 A | 4/2013 |
| CN | 103580620 A | 2/2014 |
| CN | 104796092 A | 7/2015 |
| CN | 106209709 A | 12/2016 |

OTHER PUBLICATIONS

Mylonakis "Design of a Variable Gain Amplifier (VGA) for a RF receiver with DC-Offset Correction in 90nm CMOS Technology", Sep. 2011, pp. 1-86.*

Dongi et al. "A Wideband CMOS VGA with dB-Linear Gain Based on Active Feedback and Negative Capacitance", May 2017, 25th Iranian Conference on Electrical Engineering, pp. 506-510.*

Chinese language Office Action dated Sep. 30, 2019, issued in application No. CN 201811195242.5.

Chinese language office action dated Feb. 23, 2020, issued in application No. CN 201811195242.5.

"Foundations of Electronic Circuits;" Jan. 1986; pp. 507-510.

English language translation of "Foundations of Electronic Circuits".

Chinese language office action dated Jul. 30, 2020, issued in application No. CN 201811195242.5.

* cited by examiner

RECEIVING CIRCUITS AND METHODS FOR INCREASING BANDWIDTH

CROSS REFERENCE TO RELATED APPLICATIONS

This Application claims priority of China Patent Application No. 201811195242.5 filed on Oct. 15, 2018, the entirety of which is incorporated by reference herein.

BACKGROUND OF THE INVENTION

Field of the Invention

The invention generally relates to a receiving circuit technology, and more particularly, relates to a receiving circuit technology by means of configuring a negative impedance converter in the linear equalizer circuit (LEQ) of the receiving circuit and configuring a feedback circuit in the variable gain amplifier (VGA) of the receiving circuit.

Description of the Related Art

As technology evolves, the requirements on the bandwidth of data transmissions have been increasing. In receivers of traditional electronic devices, in order to meet the higher data transmission requirements, more power will be consumed. In addition, for the higher power consumption, the receiver may need to operate in a higher linear region for a higher voltage to meet requirements of variable environments. Therefore, in the process of manufacturing the current receiver, more amplifiers in series need to be configured in the receiver to meet the requirement of a wider voltage-gain range. As a result, based on present process of manufacturing a receiver, a larger layout area is needed, and the size of the receiver needs to be enlarged. Therefore, how to increase the performance of the receiver and decrease the power consumption is worth discussing.

BRIEF SUMMARY OF THE INVENTION

A receiving circuit and method for increasing the bandwidth are provided to overcome the aforementioned problems.

An embodiment of the invention provides a receiving circuit. The receiving circuit comprises a linear equalizer circuit and a variable gain amplifier. The linear equalizer circuit comprises a first negative impedance converter, wherein the first negative impedance converter generates a capacitance value at the output end of the linear equalizer circuit. The variable gain amplifier is coupled to the linear equalizer circuit, and comprises a first-stage gain circuit and a feedback circuit. The first-stage gain circuit is coupled to the feedback circuit, wherein the feedback circuit generates a zero-point at the output end of the first-stage gain circuit.

An embodiment of the invention provides a method for increasing the bandwidth. The method for increasing the bandwidth may be applied to a receiving circuit. The method for increasing the bandwidth comprises the following steps: generating a capacitance value at the output end of a linear equalizer circuit by means of a first negative impedance converter of the linear equalizer circuit of the receiving circuit; receiving an output signal generated by a first-stage gain circuit of a variable gain amplifier of the receiving circuit through the linear equalizer circuit; and generating a zero-point at the output end of the first-stage gain circuit by a feedback circuit of the variable gain amplifier.

Other aspects and features of the invention will become apparent to those with ordinary skill in the art upon review of the following descriptions of specific embodiments of receiving circuit and method for increasing the bandwidth.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
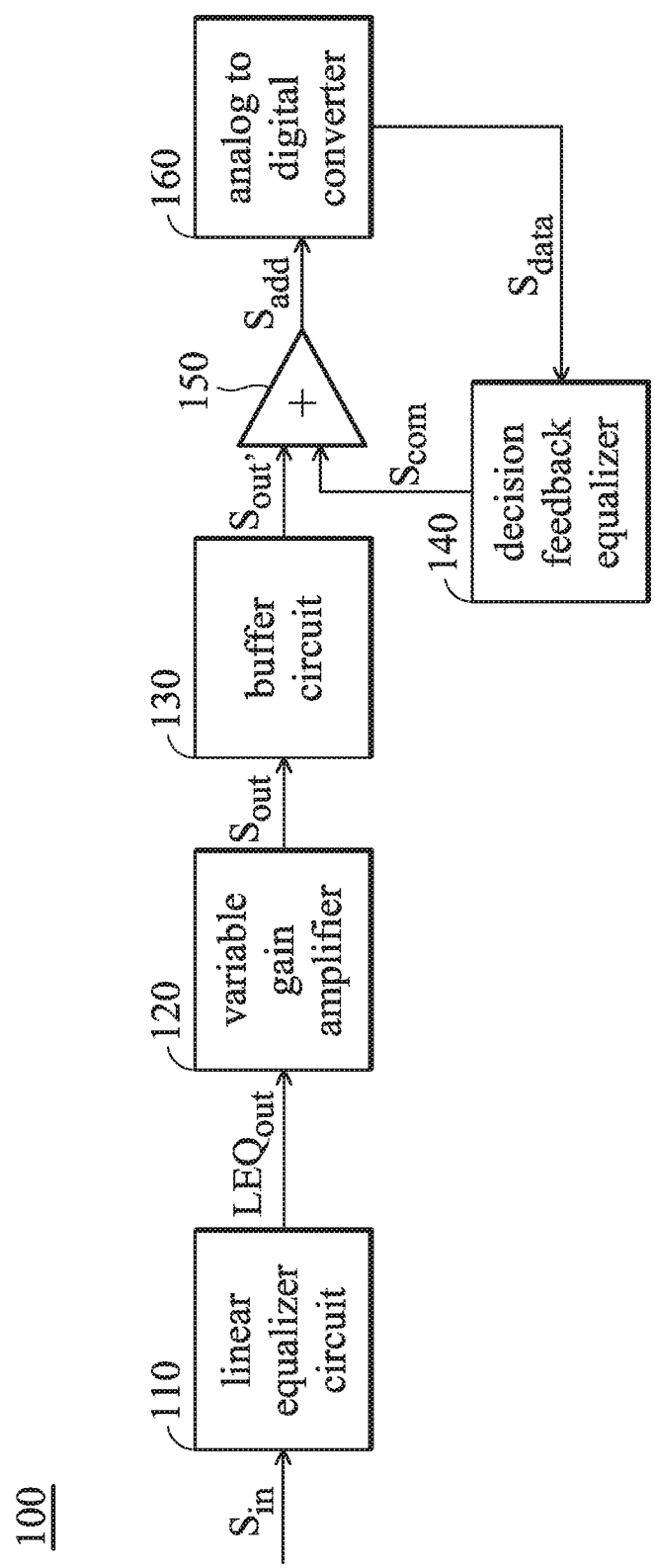
FIG. 1 is a block diagram of a receiving circuit 100 according to an embodiment of the invention.

FIG. 1 is a block diagram of a receiving circuit 100 according to an embodiment of the invention. As shown in FIG. 1, the receiving circuit 100 comprises a linear equalizer (LEQ) circuit 110, a variable gain amplifier (VGA) 120, a buffer circuit 130, a decision feedback equalizer (DFE) 140, an adder 150 and an analog to digital converter 160.

As shown in FIG. 1, the linear equalizer circuit 110 receives an input signal $S_{in}$ and outputs a signal $LEQ_{out}$ to the variable gain amplifier 120, wherein the first frequency component of the input signal $S_{in}$ is suppressed and the second frequency component of the input signal $S_{in}$ is enhanced. According to an embodiment of the invention, the linear equalizer circuit 110 may suppress the low-frequency component of the input signal $S_{in}$ and enhance the high-frequency component of the input signal $S_{in}$ to correct the frequency dispersion of the input signal $S_{in}$, i.e. in the linear equalizer circuit 110, after the frequency dispersion correction, the input signal $S_{in}$ may be transformed into the signal $LEQ_{out}$. According to an embodiment of the invention, the input signal $S_{in}$ may be analog, e.g. the input signal $S_{in}$ is a pair of differential voltage signals.

As shown in FIG. 1, the variable gain amplifier 120 receives the signal(s) $LEQ_{out}$ and output an output signal $S_{out}$, and the variable gain amplifier 120 may enhance or attenuate the signal $LEQ_{out}$. According to an embodiment of the invention, the variable gain amplifier 120 may enhance or attenuate the signal $LEQ_{out}$ to generate the output signal $S_{out}$. The output signal $S_{out}$ may content the requirement of the following circuits, e.g. the amplitude requirement to the input signal of the analog to digital converter 160.

As shown in FIG. 1, the buffer circuit 130 receives the output signal $S_{out}$ and output a signal $S_{out}'$. The buffer circuit 130 buffers the output signal $S_{out}$ to improve the driving ability of the output signal $S_{out}$. Namely, the signal $S_{out}'$ is the buffered output signal $S_{out}$. The signal $S_{out}'$ may be added to the compensation signal $S_{com}$ output by the decision feedback equalizer 140 at the adder 150, and then the adder 150 outputs a signal $S_{add}$ to the analog to digital converter 160. After the analog to digital converter 160 performs the analog to digital operation for the signal $S_{add}$, the analog to digital converter 160 may output a result $S_{data}$ to the decision feedback equalizer 140. Then, the decision feedback equalizer 140 may determine a new compensation signal $S_{com}$ according to the result $S_{data}$ (0 or 1). The new compensation signal $S_{com}$ may be added to next signal $S_{out}'$ to compensate for the next signal $S_{out}'$. The linear equalizer circuit 110 and the variable gain amplifier 120 shown in FIG. 1 are important modules of the receiving circuit 100. They provide stable signals to following circuits, e.g. the analog to digital converter 160. It should be noted that FIG. 1 presents a simplified block diagram in which only the elements relevant to the invention are shown. However, the invention should not be limited to what is shown in FIG. 1.

Figure 2A:
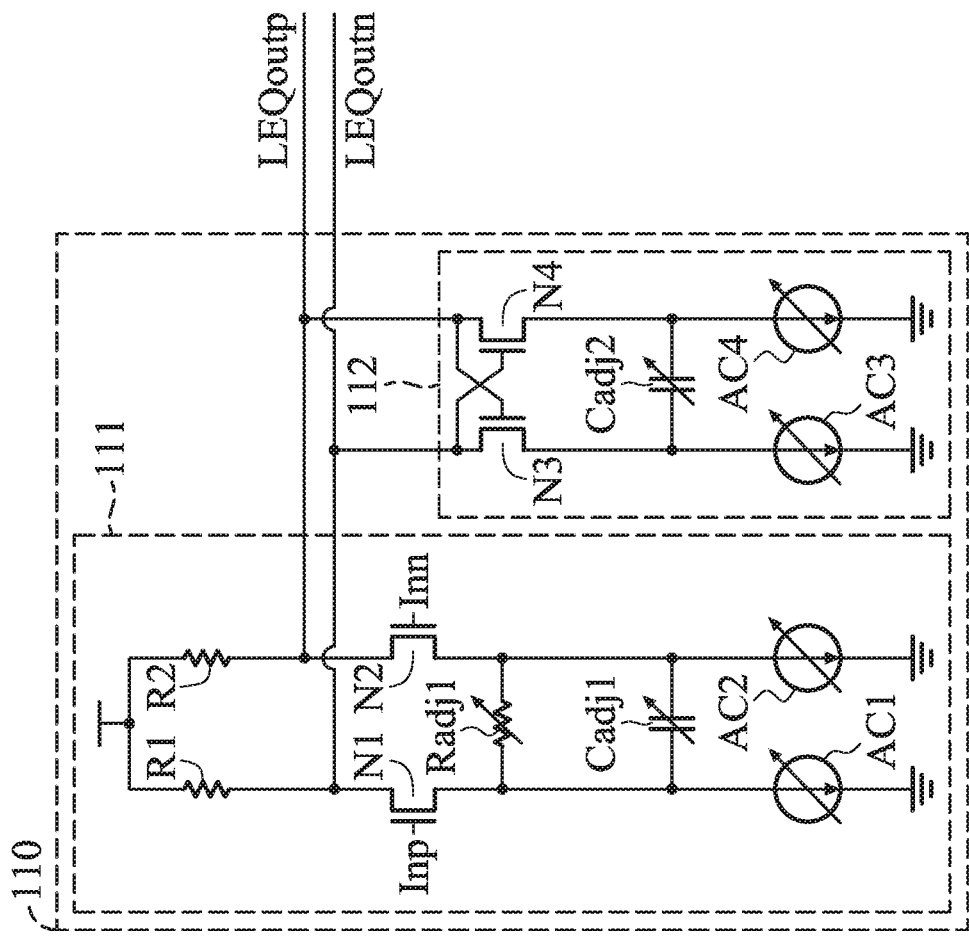
FIG. 2A is a circuit diagram of a linear equalizer circuit 110 according to an embodiment of the invention.
Figure 2B:
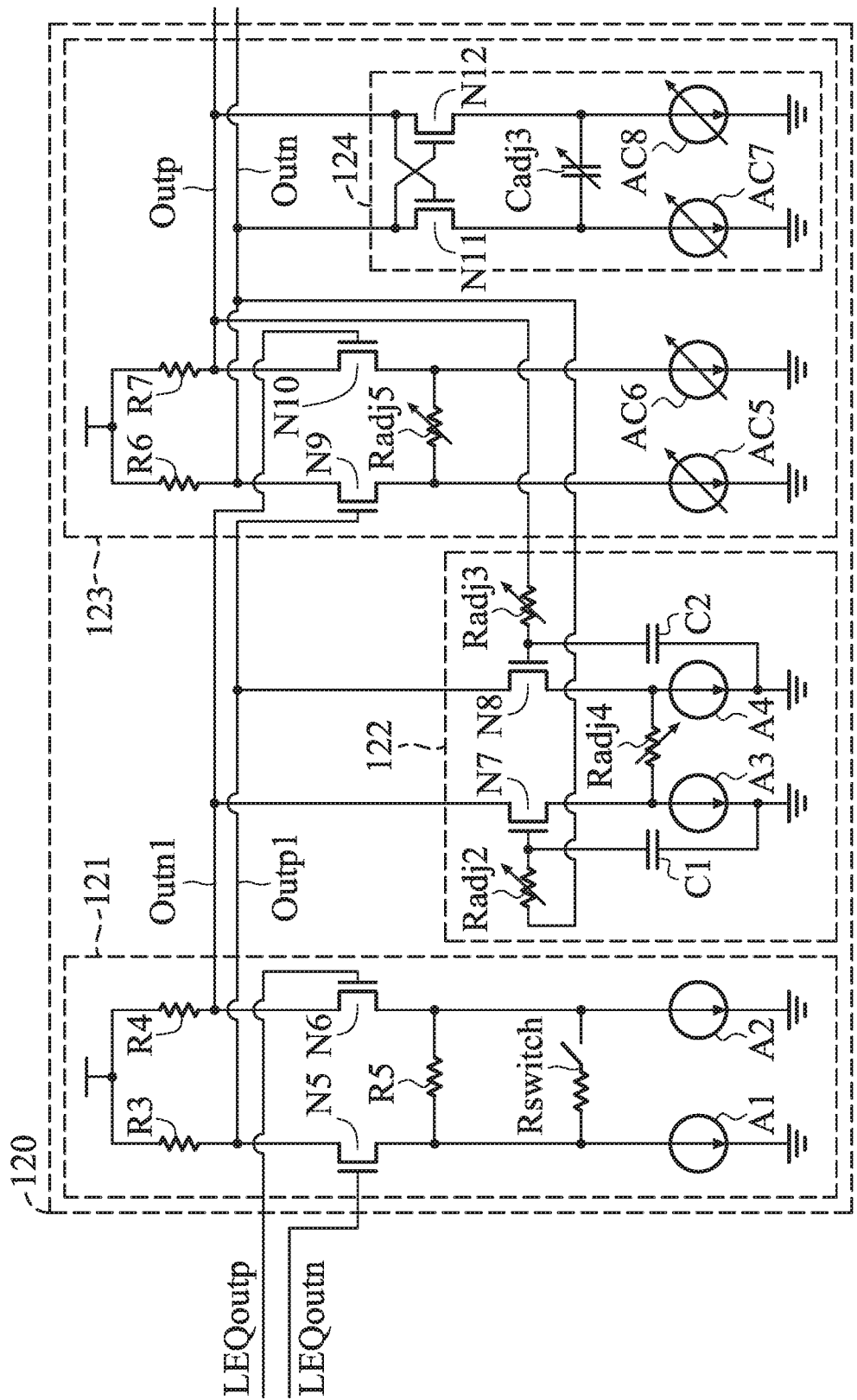
FIG. 2B is a circuit diagram of a variable gain amplifier 120 according to an embodiment of the invention.

FIGS. 2A-2B are circuit diagrams of a linear equalizer circuit 110 and a variable gain amplifier 120 according to an embodiment of the invention, wherein FIG. 2A is a circuit diagram of a linear equalizer circuit 110 according to an embodiment of the invention, and FIG. 2B is a circuit diagram of a variable gain amplifier 120 according to an embodiment of the invention.

As shown in FIG. 2A, the linear equalizer circuit 110 comprises an equalizer 111 and a first negative impedance converter 112. The equalizer 111 is coupled to the first negative impedance converter 112. As shown in FIG. 2A the equalizer 111 may comprise a first resistor R1, a second resistor R2, a first transistor N1, a second transistor N2, a first adjustable resistor Radj1, a first adjustable capacitor Cadj1, a first adjustable power source AC1 and a second adjustable power source AC2. The input end (gate) Inp of the first transistor N1 and the input end (gate) Inn of the second transistor N2 receives the input signal $S_{in}$. The input signal $S_{in}$ may be a pair of differential signals, wherein the input end (gate) Inp of the first transistor N1 may receive one signal of the pair of differential signals and the input end (gate) Inn of the second transistor N2 may receive the other signal of the pair of differential signals. In another embodiment, the input signal $S_{in}$ may be a single-end signal, wherein either the input end (gate) Inp of the first transistor N1 or the input end (gate) Inn of the second transistor N2 may receive the single-end signal, and the other of both the input end (gate) Inp of the first transistor N1 and the input end (gate) Inn of the second transistor N2 may connect to a steady voltage. Both ends of the first adjustable resistor Radj 1 are respectively coupled to the source of the first transistor N1 and the source of the second transistor N2. Both ends of the first adjustable capacitor Cadj1 are respectively coupled to the source of the first transistor N1 and the source of the second transistor N2. The first adjustable resistor Radj1 and the first adjustable capacitor Cadj1 may be combined to be a capacitor-transistor negative feedback equalizer. The equalizer 111 may adjust the gain of the equalizer 111 by adjusting the first adjustable resistor Radj1 and the first adjustable capacitor Cadj1. Specifically, the first adjustable resistor Radj1 is used to provide variable low-frequency gain and the first adjustable capacitor Cadj1 is used to provide variable high-frequency gain to make the linear equalizer circuit 110 be able to adjust the first frequency component, e.g. a low frequency component, and the second frequency component, e.g. a high frequency component, of the input signal $S_{in}$ and to ensure a larger compensation range.

As shown in FIG. 2A, the first negative impedance converter 112 may comprise a third transistor N3, a fourth transistor N4, a second adjustable capacitor Cadj2, a third adjustable power source AC3 and a fourth adjustable power source AC4. The drain of the third transistor N3 is coupled to the drain of the first transistor N1 of the equalizer 111, and the gate of the third transistor N3 is coupled to the drain of the fourth transistor N4. The drain of the fourth transistor N4 is coupled to the drain of the second transistor N2, and the gate of the fourth transistor N4 is coupled to the drain of the third transistor N3. The third transistor N3 and the fourth transistor N4 may be combined to be a negative impedance conversion module. The first negative impedance converter 112 is connected to the equalizer 111 in parallel. Benefit from the negative impedance conversion module combined with the third transistor N3 and the fourth transistor N4, the first negative impedance converter 112 may generate a negative capacitor according to the second adjustable capacitor Cadj2. The negative capacitor is connected to the equalizer 111 in parallel to reduce the whole output capacitance value of the linear equalizer circuit 110. Namely, the third transistor N3 and the fourth transistor N4 are combined to be a negative impedance conversion module to convert the second adjustable capacitor Cadj2 to be the negative capacitor. The negative capacitor generated according to the negative impedance conversion module and the second adjustable capacitor Cadj2 by the first negative impedance converter 112 is connected with the positive capacitor generated at the output end of the equalizer 111 in parallel, i.e. add the negative capacitance value (the capacitance value of the negative capacitor) to the positive capacitance value (the capacitance value of the positive capacitor) to obtain the whole output capacitance value of the output capacitor (or equivalent capacitor) Cp (not shown in figures) of the linear equalizer circuit 110. Compared to a normal linear equalizer circuit (without the negative capacitor), the output capacitance value of the output capacitor Cp of the whole linear equalizer circuit 110 is decreased. The output capacitor Cp is the output capacitor of the output end of the linear equalizer circuit 110, i.e. output capacitor generated at the end LEQoutp or the end LEQoutn shown in FIG. 2A. The whole output impedance of the linear equalizer circuit 110 is decreased, so that the operation bandwidth of the linear equalizer circuit 110 will be increased in the same power consumption condition, or the power consumption of the linear equalizer circuit 110 will be reduced in the same bandwidth condition, wherein the whole output impedance of the linear equalizer circuit 110 comprises the output resistor and the output capacitor Cp.

The transfer function for the linear equalizer circuit 110 shown in FIG. 2A is:

$$\frac{Vout1(s)}{Vin(s)} = \frac{g_{m,N1,N2}}{C_{adj1}} \times \frac{s + \frac{1}{R_{adj1}C_{adj1}}}{\left(s + \frac{1 + \frac{1}{2}g_{m,N1,N2}R_{adj1}^2}{R_{adj1}C_{adj1}}\right) \times \left(s + \frac{1}{R_{1,2}C_p}\right)},$$

wherein $g_{m,N1,N2}$ is the transconductance of the first transistor N1 or the second transistor N2, $R_{adj1}$ is the resistance value of the first adjustable resistor Radj1, $C_{adj1}$ is the capacitance value of the first adjustable capacitor Cadj1, s is the complex frequency of the Laplace transform, $R_{1,2}$ is the resistance value of the first resistor R1 or the second resistor R2, $C_p$ is the output capacitance value of the output capacitor Cp, i.e. the output capacitor generated at the end LEQoutp or the end LEQoutn.

According to the transfer function of the linear equalizer circuit 110, the linear equalizer circuit 110 may generate one zero-point and two pole-points, wherein the zero-point is corresponded to the lowest frequency and the output pole-points generated by the output capacitor Cp is corresponded to the highest frequency. Compared to the normal linear equalizer circuit (without the negative capacitor), the output capacitor Cp of the whole linear equalizer circuit 110 is decreased, and the output pole-points generated by the output capacitor Cp will be moved to a higher frequency to make the original highest frequency can be moved to a higher frequency. Therefore, for the same power consumption condition, the operation bandwidth of the linear equalizer circuit 110 will be increased, or for the same bandwidth condition, the power consumption of the linear equalizer circuit 110 will be reduced.

In addition, as shown in FIG. 2B, the variable gain amplifier 120 may comprise a first-stage gain circuit 121, a second-stage gain circuit 123 and a feedback circuit 122.

The first-stage gain circuit 121 may comprise a third resistor R3, a fourth resistor R4, a fifth resistor R5, a fifth transistor N5, a sixth transistor N6, a resistor switch Rswitch, a first power source A1 and a second power source A2. The gate of the fifth transistor N5 is coupled to the drain of the third transistor N3 and the gate of the sixth transistor N6 is coupled to the drain of the fourth transistor N4. The drain of the fifth transistor N5 is coupled to the third resistor R3 and the drain of the sixth transistor N6 is coupled to the fourth resistor R4. The source of the fifth transistor N5 is coupled to the fifth resistor R5, resistor switch Rswitch and the first power source A1, and the source of the sixth transistor N6 is coupled to the fifth resistor R5, resistor switch Rswitch and the second power source A2. According to an embodiment of the invention, resistor switch Rswitch is composed of a resistor and a switch which are connected in serial. The first-stage gain circuit 121 may generate different gain values by closing or opening the switch of the resistor switch Rswitch. When the switch is opened, the first-stage gain circuit 121 generates a first gain, the first gain value is generated according to the resistor R5. When the switch is closed, the first-stage gain circuit 121 generates a second gain, the second gain value is generated according to the resistor R5 and the resistor of the resistor switch Rswitch which are connected in parallel, wherein the second gain value is greater than the first gain value.

The second-stage gain circuit 123 comprises a sixth resistor R6, a seventh resistor R7, a fifth adjustable resistor Radj5, a ninth transistor N9, a tenth transistor N10, a fifth adjustable power source AC5 and a sixth adjustable power source AC6. The gate of the ninth transistor N9 is coupled to the drain of the eighth transistor N8, and the gate of the tenth transistor N10 is coupled to the drain of the seventh transistor N7. The drain of the ninth transistor N9 is coupled to the sixth resistor R6 and the drain of the tenth transistor N10 is coupled to the seventh resistor R7. The source of the ninth transistor N9 is coupled to the fifth adjustable resistor Radj5 and the fifth adjustable power source AC5, and the source of the tenth transistor N10 is coupled to the fifth adjustable resistor Radj5 and the sixth adjustable power source AC6. The second-stage gain circuit 123 may adjust its gain by adjusting the fifth adjustable resistor Radj 5.

The feedback circuit 122 may comprise a second adjustable resistor Radj2, a third adjustable resistor Radj3, a fourth adjustable resistor Radj4, a seventh transistor N7, an eighth transistor N8, a first capacitor C1, a second capacitor C2, a third power source A3 and a fourth power source A4. The gate of the seventh transistor N7 is coupled to the second adjustable resistor Radj2 and the first capacitor C1, and the gate of the eighth transistor N8 is coupled to the third adjustable resistor Radj3 and the second capacitor C2. The drain of the seventh transistor N7 is coupled to the drain of the sixth transistor N6 and the drain of the eighth transistor N8 is coupled to the drain of the fifth transistor N5. The source of the seventh transistor N7 is coupled to the fourth adjustable resistor Radj4 and the third power source A3, and the source of the eighth transistor N8 is coupled to the fourth adjustable resistor Radj4 and the fourth power source A4. The feedback circuit 122 is used to generate a zero-point in the variable gain amplifier 120. Specifically, the feedback circuit 122 transmits the signal from the output end Outp of the second-stage gain circuit 123 to the gate of the eighth transistor N8 through the third adjustable resistor Radj3 to control the magnitude of the current which is provided from the fourth power source A4 to the output end Outp1 of the first-stage gain circuit 121. One end of the second capacitor C2 of the feedback circuit 122 is coupled to the gate of the eighth transistor N8, the other end of the second capacitor C2 is coupled to a ground. Namely, the second capacitor C2 is connected to the circuit between the gate of the eighth transistor N8 and the ground in parallel to generate a pole-point in the feedback circuit 122, i.e. to generate a zero-point in the variable gain amplifier 120, to increase the bandwidth of the variable gain amplifier 120. Furthermore, the feedback circuit 122 may increase the linear range of the variable gain amplifier 120. Furthermore, after the signal output from the output ends Outp1 and Outn1 of the first-stage gain circuit 121 are processed by feedback circuit 122, the processed signal will be taken as the input signal of the second-stage gain circuit 123.

The second-stage gain circuit 123 further comprises a second negative impedance converter 124. The second negative impedance converter 124 comprises an eleventh transistor N11, a twelfth transistor N12, a third adjustable capacitor Cadj3, a seventh adjustable power source AC7 and an eighth adjustable power source AC8. The drain of the eleventh transistor N11 is coupled to the drain of the ninth transistor N9, and the gate of the eleventh transistor N11 is coupled to the drain of the twelfth transistor N12. The drain of the twelfth transistor N12 is coupled to the drain of the tenth transistor N10, and the gate of the twelfth transistor N12 is coupled to the drain of the eleventh transistor N11. The source of the eleventh transistor N11 is coupled to one end of the third adjustable capacitor Cadj3 and the seventh adjustable power source AC7, and the source of the twelfth transistor N12 is coupled to the other end of the third adjustable capacitor Cadj3 and the eighth adjustable power source AC8. Similar with the first negative impedance converter 112, the eleventh transistor N11 and the twelfth transistor N12 compose to be a negative impedance conversion module, and the second negative impedance converter 124 is connected to the second-stage gain circuit 123 in parallel. Benefit from the negative impedance conversion module composed of the eleventh transistor N11 and the twelfth transistor N12, the second negative impedance converter 124 may generate a negative capacitor according to the third adjustable capacitor Cadj3 to reduce the output capacitor (or equivalent capacitor) Cp' (not shown in figures) of the whole second-stage gain circuit 123, i.e. the output capacitor generated by the second negative impedance converter 124 at the output ends Outp or Outn of the variable gain amplifier 120. The output capacitor Cp' may move the output pole-point generated by the variable gain amplifier 120 to a higher frequency to make the original highest frequency can be moved to be higher. Therefore, for the same power consumption condition, the operation bandwidth of the variable gain amplifier 120 will be increased, or for the same bandwidth condition, the power consumption of the variable gain amplifier 120 will be reduced.

Figure 3:
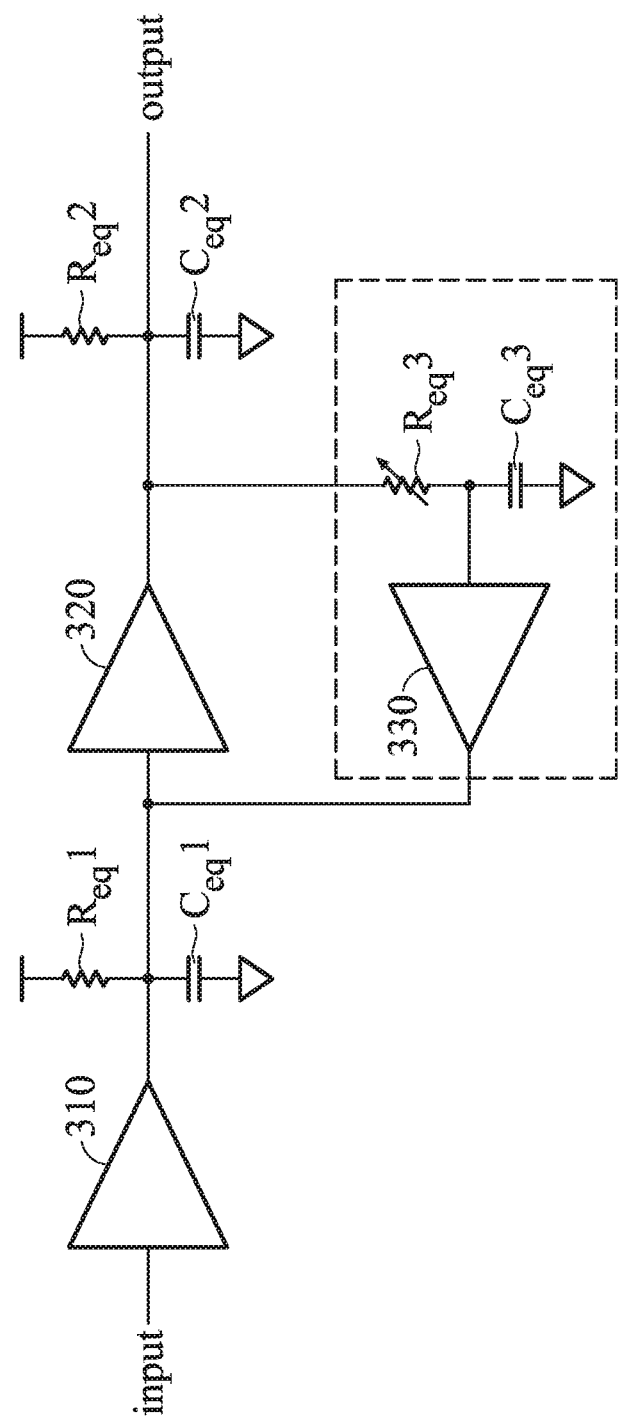
FIG. 3 is a schematic diagram of an equivalent circuit of the variable gain amplifier 120 according to an embodiment of the invention.

FIG. 3 is a schematic diagram of an equivalent circuit of the variable gain amplifier 120 according to an embodiment of the invention. As shown in FIG. 3, the variable gain amplifier 120 shown in FIG. 2 may comprise a first gain circuit 310, a second gain circuit 320, a third gain circuit 330, a first equivalent resistor $R_{eq}1$, a second equivalent resistor $R_{eq}2$, a third equivalent resistor $R_{eq}3$, a first equivalent capacitor $C_{eq}1$, a second equivalent capacitor $C_{eq}2$, and a third equivalent capacitor $C_{eq}3$. The first gain circuit 310 may be regarded as the first-stage gain circuit 121, and the first equivalent resistor $R_{eq}1$ is the output resistor of the first-stage gain circuit 121, equivalently, to the third resistor R3 or the fourth resistor R4 of the first-stage gain circuit 121. The first equivalent capacitor $C_{eq}1$ is the output capacitor of the output end Outp1 or the output end Outn1 of the first-stage gain circuit 121. The second gain circuit 320 may be regarded as the second-stage gain circuit 123, and the second equivalent resistor $R_{eq}2$ is the output resistor of the second-stage gain circuit 123, equivalently, to the sixth resistor R6 or the seventh resistor R7 of the second-stage gain circuit 123. The second equivalent capacitor $C_{eq}2$ is the output capacitor Cp' of the output end outn or the output end outp of the second-stage gain circuit 123. The third gain circuit 330 may be regarded as the feedback circuit 122, and the third equivalent resistor $R_{eq}3$ is the output resistor of the feedback circuit 122, equivalently, to the second adjustable resistor Radj2 or the third adjustable resistor Radj3 of the feedback circuit 122. The third equivalent capacitor $C_{eq}3$ is the output capacitor of the feedback circuit 122, equivalently, to the first capacitor C1 or the second capacitor C2 of the feedback circuit 122.

As shown in FIG. 3, the third gain circuit 330 (i.e. the feedback circuit 122 of FIG. 2) may generate the pole-point in its each group of adjustable resistor and capacitor (e.g. the second adjustable resistor Radj2 and the first capacitor C1, or the second adjustable resistor Radj3 and the second capacitor C2), and transmit the pole-point to the output end of the first gain circuit 310 (i.e. the output ends Outp1 and Outn 1 of the first-stage gain circuit 121) to generate the zero-point on the positive path of the variable gain amplifier 120. That is to say, the third gain circuit 330 may feedback the output signal of the second gain circuit 320 to the positive path to generate the zero-point in the transfer function of the output Vout(s) and the input Vout1(s) of the variable gain amplifier 120 through the third equivalent resistor $R_{eq}3$ and the third equivalent capacitor $C_{eq}3$ to increase the bandwidth. The transfer function of the output Vout(s) and the input Vout1(s) of the variable gain amplifier 120 may be shown as below:

$$\frac{Vout(s)}{Vout1(s)} = \frac{Gm1 Gm2 R_{eq}1 R_{eq}2 (1 + s R_{eq}3 C_{eq}3)}{Gm2 Gm3 R_{eq}1 R_{eq}2 + (1 + s R_{eq}1 C_{eq}1)(1 + s R_{eq}2 C_{eq}2)(1 + s R_{eq}3 C_{eq}3)},$$

wherein Gm1 is the gain of the first gain circuit 310, i.e. the gain generated by the fifth transistor N5, the sixth transistor N6, the fifth resistor R5, resistor switch Rswitch of the first-stage gain circuit 121. Gm2 is the gain of the second gain circuit 320, i.e. the gain generated by the ninth transistor N9, the tenth transistor N10 and the fifth variable resistor Radj5 of the second-stage gain circuit 123. Gm3 is the gain of the third gain circuit 330, i.e. the gain generated by the seventh transistor N7, the eighth transistor N8 and the fourth variable resistor Radj4 of the feedback circuit 122. The transfer function for the variable gain amplifier 120 multiplied the transfer function for the linear equalizer circuit 110 is the transfer function for the receiving circuit 100. Because the bandwidth of the linear equalizer circuit 110 and the variable gain amplifier 120 has been increased, the bandwidth of the receiving circuit 100 will be increased.

Figure 4:
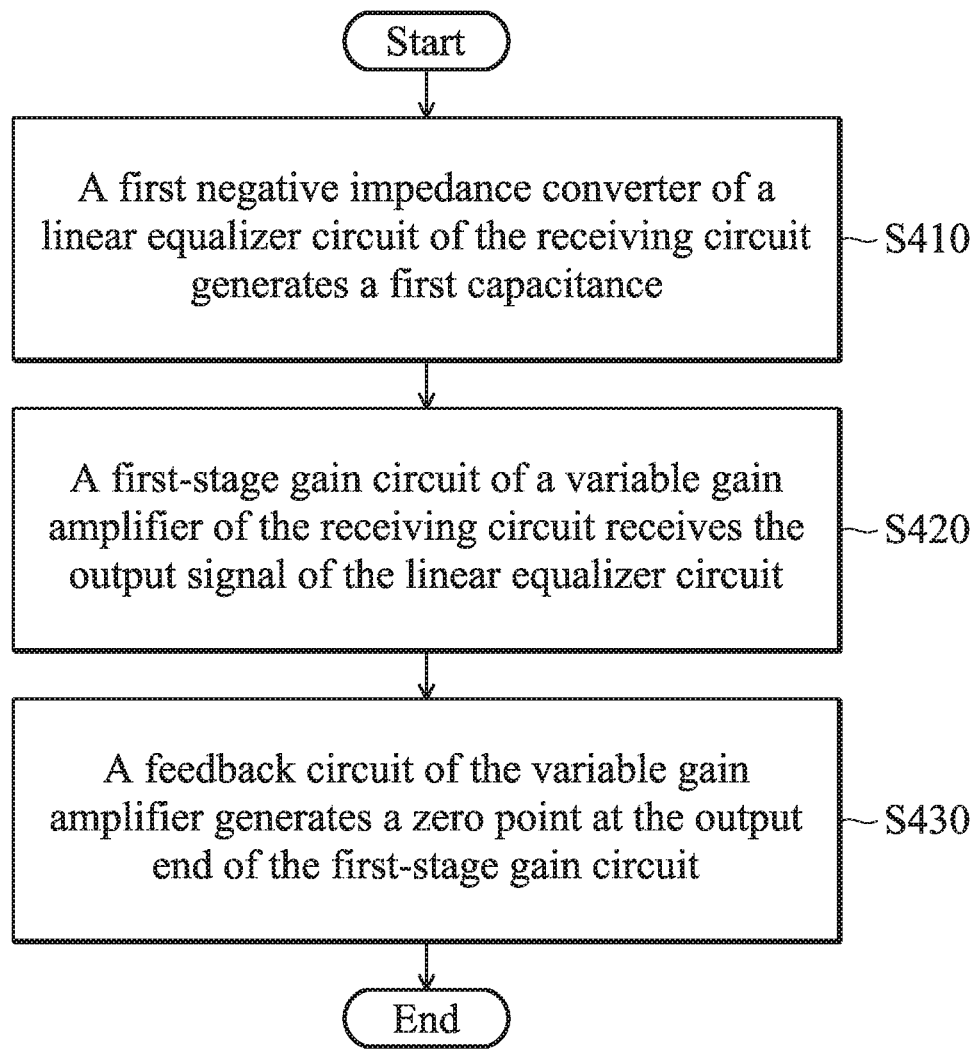
FIG. 4 is a flow chart illustrating the method for increasing the bandwidth according to an embodiment of the invention.

FIG. 4 is a flow chart illustrating the method for increasing the bandwidth according to an embodiment of the invention. The method for increasing the bandwidth may be applied to the receiving circuit 100. As shown in FIG. 4, in step S410, a first negative impedance converter of a linear equalizer circuit of the receiving circuit 100 may generate a first capacitance at the output end of the linear equalizer circuit. Compared to the linear equalizer circuit without the negative impedance converter, the negative impedance converter of a linear equalizer circuit make the first capacitance become smaller to extend the upper limit of the bandwidth of the receiving circuit 100 to be a higher frequency. In step S420, a first-stage gain circuit of a variable gain amplifier of the receiving circuit 100 may receive the output signal of the linear equalizer circuit and a second-stage gain circuit of the variable gain amplifier of the receiving circuit 100 may receive the output signal of the first-stage gain circuit. In step S430, a feedback circuit of the variable gain amplifier of the receiving circuit 100 may receive the output signal of the second-stage gain circuit and feedback the output signal generated by the second-stage gain circuit to the first-stage gain circuit to generate a zero point at the output end of the first-stage gain circuit to increase the bandwidth of the receiving circuit 100.

In some embodiments of the invention, the method for increasing the bandwidth further comprises generating the variable low-frequency gain and variable high-frequency gain by adjusting an adjustable resistor and an adjustable capacitor of an equalizer of the linear equalizer circuit.

In some embodiments of the invention, the method for increasing the bandwidth further comprises that when a resistor switch of the first-stage gain circuit is opened, the first-stage gain circuit may generate a first gain, and when the resistor switch of the first-stage gain circuit is closed, the first-stage gain circuit may generate a second gain, wherein the second gain is greater than the first gain.

In some embodiments of the invention, the method for increasing the bandwidth further comprises generating a negative capacitance at the output end of the variable gain amplifier by a second negative impedance converter of the variable gain amplifier to further extend the upper limit of the bandwidth of the receiving circuit 100 to be higher.

According to the receiving circuit and method for increasing the bandwidth provided in the invention, a first negative impedance converter is configured in the linear equalizer of the receiving circuit to reduce the whole output capacitance of the linear equalizer. Therefore, the operation bandwidth of the linear equalizer will be increased, and the power consumption of the linear equalizer will be reduced. Furthermore, According to the receiving circuit and method for increasing the bandwidth provided in the invention, a feedback circuit is configured in the variable gain amplifier of the receiving circuit to generate a zero-point in the output end of the first-stage gain circuit of a variable gain amplifier to increase the bandwidth and the linear region of the first-stage gain circuit. Furthermore, unlike traditional receiving circuit needs to cascade at least three stages of gain circuits for the variable gain amplifier, the receiving circuit provided in the invention may reduce the gain stages. Therefore, the problem of the larger peak value in the low gain will be resolved.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects of the invention. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A receiving circuit, comprising:
   a linear equalizer circuit, comprising a first negative impedance converter, the first negative impedance converter generates a first capacitance; and
   a variable gain amplifier, coupled to the linear equalizer circuit and comprising a first-stage gain circuit and a feedback circuit, wherein the first-stage gain circuit is coupled to the feedback circuit, and the feedback circuit generates a zero-point at an output end of the first-stage gain circuit,
   wherein the variable gain amplifier further comprises a second-stage gain circuit, the second-stage gain circuit is coupled to the first-stage gain circuit and the feedback circuit to feed back the output signal of the second-stage gain circuit to the output end of the first-stage gain circuit through the feedback circuit,
   wherein the second-stage gain circuit further comprises a second negative impedance converter, and
   wherein the second negative impedance converter comprises a third adjustable capacitor and a second negative impedance conversion module, the second negative impedance conversion module is coupled to the feedback circuit and converts the third adjustable capacitor to generate a third capacitance.

2. The receiving circuit of claim 1, wherein the linear equalizer circuit further comprises an equalizer, the equalizer generates a second capacitance, and the first negative impedance converter is connected to the equalizer in parallel to reduce an output capacitance of the linear equalizer circuit.

3. The receiving circuit of claim 2, wherein the equalizer comprises a first adjustable resistor and a first adjustable capacitor, the first adjustable resistor and the first adjustable capacitor are respectively configured to provide variable low-frequency gain and variable high-frequency gain.

4. The receiving circuit of claim 2, wherein the first negative impedance converter comprises a second adjustable capacitor and a first negative impedance conversion module, the first negative impedance conversion module is coupled to the equalizer and converts the second adjustable capacitor to generate the first capacitance.

5. The receiving circuit of claim 1, wherein the first-stage gain circuit comprises a resistor switch, when the resistor switch is opened, the first-stage gain circuit generates a first gain, when the resistor switch is closed, the first-stage gain circuit generates a second gain, wherein the second gain is greater than the first gain.

6. The receiving circuit of claim 1, wherein the second negative impedance converter is connected to the second-stage gain circuit in parallel to reduce an output capacitance of the variable gain amplifier.

7. A method for increasing bandwidth, applied to a receiving circuit, comprising:
   generating a first capacitance by a first negative impedance converter of a linear equalizer circuit of the receiving circuit;
   receiving an output signal generated by the linear equalizer circuit by a first-stage gain circuit of a variable gain amplifier of the receiving circuit;
   coupling a second-stage gain circuit of the variable gain amplifier to the first-stage gain circuit and a feedback circuit of the variable gain amplifier, to feed back the output signal of the second-stage gain circuit to the output end of the first-stage gain circuit through the feedback circuit, wherein the second-stage gain circuit further comprises a second negative impedance converter;
   using a second negative impedance conversion module of the second negative impedance converter to convert a third adjustable capacitor of the second negative impedance converter to generate a third capacitance, wherein the first negative impedance conversion module is coupled to an equalizer of the linear equalizer circuit; and
   generating a zero-point at the output end of the first-stage gain circuit by the feedback circuit of the variable gain amplifier.

8. The method for increasing the bandwidth of claim 7, further comprising:
   generating a second capacitance by an equalizer of the linear equalizer circuit; and
   reducing an output capacitance of the linear equalizer circuit by the first negative impedance converter connected to the equalizer in parallel.

9. The method for increasing the bandwidth of claim 7, further comprising:
   respectively generating variable low-frequency gain and variable high-frequency gain by a first adjustable resistor and a first adjustable capacitor of the equalizer.

10. The method for increasing the bandwidth of claim 7, further comprising:
    using a first negative impedance conversion module of the first negative impedance converter to convert a second adjustable capacitor of the first negative impedance converter to generate the first capacitance value, wherein the first negative impedance conversion module is coupled to an equalizer of the linear equalizer circuit.

11. The method for increasing the bandwidth of claim 7, further comprising:
- generating a first gain by the first-stage gain circuit, when a resistor switch of the first-stage gain circuit is opened; and
- generating a second gain by the first-stage gain circuit, when the resistor switch of the first-stage gain circuit is closed,
- wherein the second gain is greater than the first gain.

12. The method for increasing the bandwidth of claim 7, further comprising:
- connecting the second negative impedance converter to the second-stage gain circuit in parallel to reduce an output capacitance of the variable gain amplifier.

* * * * *